United States Patent [19]
Decker et al.

[11] Patent Number: 5,223,754
[45] Date of Patent: Jun. 29, 1993

[54] RESISTIVE FUSE CIRCUITS FOR IMAGE SEGMENTATION AND SMOOTHING

[75] Inventors: Steve Decker, Cambridge; John L. Wyatt, Jr., Sudbury; Hae-Seung Lee, Arlington, all of Mass.

[73] Assignee: Massachusetts Institute of Technology, Cambridge, Mass.

[21] Appl. No.: 628,340

[22] Filed: Dec. 14, 1990

[51] Int. Cl.$^5$ .................. H03K 17/687; H03K 5/08
[52] U.S. Cl. ............................ 307/584; 307/585; 307/566; 307/202.1; 307/450; 338/334
[58] Field of Search ............................ 307/584–585, 307/566, 202.1, 450; 338/334

[56] References Cited

U.S. PATENT DOCUMENTS 3,369,129  2/1968  Wolterman ..................... 307/568
3,605,728  9/1971  Ogle ............................. 307/568

OTHER PUBLICATIONS

Perona et al., "A Network for multiscale image segmentation" 1988 IEEE International Symposium on Circuits and Systems, Espoo, Finland, Jun. 1988 pp. 2565–2568.
Perona et al, "Scale Space and Edge Detection Using Anistropic Diffusion" IEEE Transactions, PAMI--12(7), pp. 629–639, Jul. 1990.
Horn, B. "Parallel networks for machine vision" AI Memo No. 1071 (MIT, Cambridge 1988).
Knight, T. F. "Design of an Integrated optical sensor with on-chip processing" PhD MIT 1983.
Mead, C. A. "Analog VLSI and Neural Systems" (Addison-Wesley, Reading, 1988).
German et al. "Stochasticrelaxation, Gibbs distribution and the Bayesian restoration of images" IEEE PAMIG 721–741 (1984).
Marroquin et al, "Probabilistic solution of ill-posed problems in computational vision" Journal of the American Statistical Association, Mar. 1987, vol. 82, No. 397, pp. 76–89.
Lumsdaine et al. "Parallel distributed networks for image smoothing and segmentation in analog VLSI" Proceedings of the 28th IEEE Conference on Decision and Control Dec. 13–15, 1989, vol. 1.
Lumsdaine et al. "Nonlinear analog networks for image smoothing and segmentation" International Symposium on circuits and systems, New Orleans, La., Mar. 1–3, 1990, vol. 2.
Blake et al, "Visual Reconstruction" MIT Press, Cambridge, 1987.
Barbe, D. F. "Charge Coupled Devices" vol 38, Springer-Verlag, 1980.
Harris, et al. "Resistive fuses: Analog hardware for detecting discontinuities in early vision" Analog VLSI implementation of neural systems pp. 27–55 (Kluwer Academic Publishers) 1989.
Chua et al., "Bipolar-JFET-MOSFET Negative Resistance Devices" IEEE Transactions on Circuits and Systems, vol. LAS-32, No. 1, Jan. 1985.
Sequin et al. "Charge Transfer Devices" Academic Press 1975.
Mead, C. "A sensitive electronic photoreceptor" Chapel Hill Conferen ce on VLSI, p. 463, 1985.

Primary Examiner—Margaret R. Wambach
Attorney, Agent, or Firm—Choate, Hall & Stewart

[57] ABSTRACT

A simple transistor circuit which acts as a linear resistor for small applied voltages, but becomes extremely resistive for large applied voltages is disclosed. Two-dimensional resistive grids comprising these resistive fuses can be employed to smooth and segment discretized images in machine vision. Existing and previously proposed VLSI implementations of resistive fuses have required at least thirty-three transistors. The resistive fuse circuit of the present invention uses only four transistors in its simplest embodiment, thus making it possible to design much denser vision arrays.

35 Claims, 5 Drawing Sheets

RESISTIVE FUSE CIRCUITS FOR IMAGE SEGMENTATION AND SMOOTHING

BACKGROUND OF THE INVENTION

This invention relates to vision processing, more particularly to a resistive fuse circuit which can be used in a two-dimensional grid to perform image segmentation and smoothing.

One of the first operations performed in early vision processing is smoothing. This has a twofold purpose: first, it reduces noise, which can produce spurious edges, and second, it suppresses fine detail so it will not be detected by an edge detector. The degree to which the image should be smoothed depends on the fineness of detail one wants in the output image. For example, if the observer wants to know the pattern on a striped shirt, a fairly large amount of smoothing should be applied so that the only edges that will be detected correspond to borders between regions of different color. If the observer wants to see the weave of the cloth, very little smoothing should be applied, or the weave will be unobservable. Thus, a device that can perform smoothing at a user adjustable scale is extremely useful.

Smoothing is essentially spatial low-pass filtering, and is usually accomplished by convolving the input image with some band-limited function, often a Gaussian. Digital circuits can obviously perform a convolution, but analog circuits can also perform convolution. In fact, Gaussian convolution is fairly simple to implement in an analog method because of the relation between Gaussian convolution and the diffusion (heat) equation in a two-dimensional sheet. If the intensity distribution of an image is mapped to an infinite sheet in such a way that the initial temperature on the sheet at any point is proportional to the image intensity at the corresponding point in the image, and heat is allowed to diffuse throughout the sheet, the temperature distribution at future times is obtained from the diffusion equation:

$$c\nabla^2 T(x, y, t) = \frac{\partial}{\partial t} T(x, y, t),$$

where x and y are spatial coordinates, t is time, T(x,y,t) is the temperature distribution at time t, and c is some positive constant. This is exactly the relation that holds if the image is convolved with a Gaussian of variance $\sigma^2 = 2$ ct.

The diffusion equation governs both the diffusion of heat in a sheet and the diffusion of charge in an infinite uniform resistive sheet with uniform distributed capacitance, so they will have the same solution. A discretized, finite version of the infinite sheet can be implemented in analog VLSI by fabricating an array of nodes such that each node connects through resistors to its nearest neighbors and to ground through a capacitor, as Knight did in his optical sensor chip. A one-dimensional example is shown in FIG. 1. The image is stored, perhaps as voltages on capacitors, the light entering the imaging system is shut off, and a resistive-capacitive grid is allowed to relax for a period of time which depends on the degree of smoothing required.

Other methods have been proposed to perform smoothing because the implementation described above does not provide output continuously, which might be inconvenient for later algorithms. One network proposed for continuous smoothing is shown in FIG. 2. The capacitances to ground are replaced by conductances, and the voltage source $u_k$ represents the input image intensity at node k. The equation solved by this resistive-conductive grid is not the diffusion equation, but a discretized version of the equation $$\nabla^2 y(x) = (y(x) - u(x))/\alpha^2,$$

where y(x) is the output voltage distribution, u(x) is the input voltage distribution, and the smoothing constant $\alpha = \sqrt{R_v/R_h}$. An infinite one-dimensional network performs convolution with $$\frac{1}{2\alpha} e^{-|x|/\alpha}$$

instead of $e^{-x^2/2\sigma^2}$, so the network does not perform Gaussian smoothing. Nevertheless, this network, or a variant, seems to be the usual choice for implementing analog smoothing.

It is important to understand how edges are affected by the resistive grid. Edges can result from boundaries between separate objects or from variations in surface texture or orientation within a single object, and often provide useful information for later algorithms such as image recognition. These edges divide the complete image into several regions. Any linear smoother, such as the resistive grid mentioned above, has no knowledge of where these edges occur and will tend to blur together different regions, making it difficult for later algorithms to find and localize the edge dividing those regions. Mead solves this problem by the use of saturating horizontal resistors, thereby creating a nonlinear smoother. Other proposed solutions based on stochastic arguments and minimization of cost functionals suggest a special type of horizontal resistor (which would replace $R_h$ in FIG. 2) which has the I-V characteristic shown in FIG. 3. Harris (and earlier references within) has also made this suggestion independently. The resistive fuse acts as a normal resistor for small voltages, but fuses and passes little or no current if the voltage across its terminals exceeds a threshold voltage. Since image intensity will presumably be quite different across an edge, the resistive fuse acts as an open circuit and prevents blurring across that edge. A resistive circuit which does exactly that was first developed by Harris, but it requires 33 transistors.

SUMMARY OF THE INVENTION

The present invention involves a collection of transistor circuits, each designed to perform the function of a resistive fuse in a two-dimensional resistive grid for image segmentation and smoothing. The simplest design comprises only two n-channel and two p-channel field-effect transistors, making it possible to fabricate much denser vision arrays than those possible with the 33 transistor design of Harris. The circuit is suitable for either JFET or depletion-mode MOSFET implementations. Further designs allow the use of enhancement-mode MOSFET transistors to permit fabrication by standard processes. These designs employ control voltage sources which allow parameters such as the linear region resistance and the off-voltage of each resistive fuse to be adjustable.

An early vision processing system according to the present invention includes a two-dimensional grid of any of the resistive fuse circuit elements disclosed herein. Each node of the grid is connected to each of its nearest neighbors by a resistive fuse circuit element. Each node is functionally connected to a sensing device which converts light into an electronic signal. Control voltage sources can be shared by all resistive fuses at a given node of the grid to conserve space. Preferably, the grid of resistive fuse circuit elements and the sensing devices are all fabricated on a single microchip.

DESCRIPTION OF THE PREFERRED EMBODIMENT

Chua circuit

Figure 1:
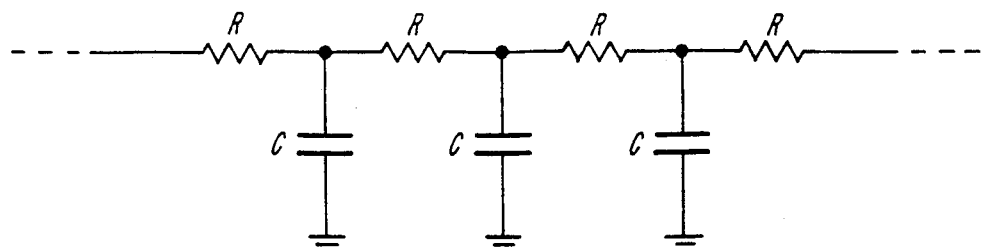
FIG. 1 is a circuit diagram of a prior art one-dimensional resistive-capacitive grid for image smoothing.
Figure 2:
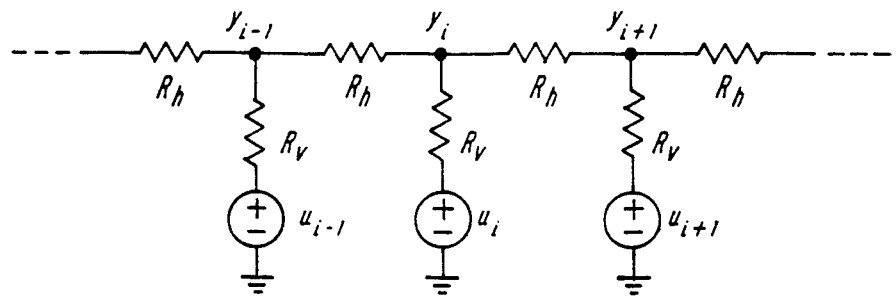
FIG. 2 is a circuit diagram of a prior art one-dimensional resistive grid for image smoothing.
Figure 3:
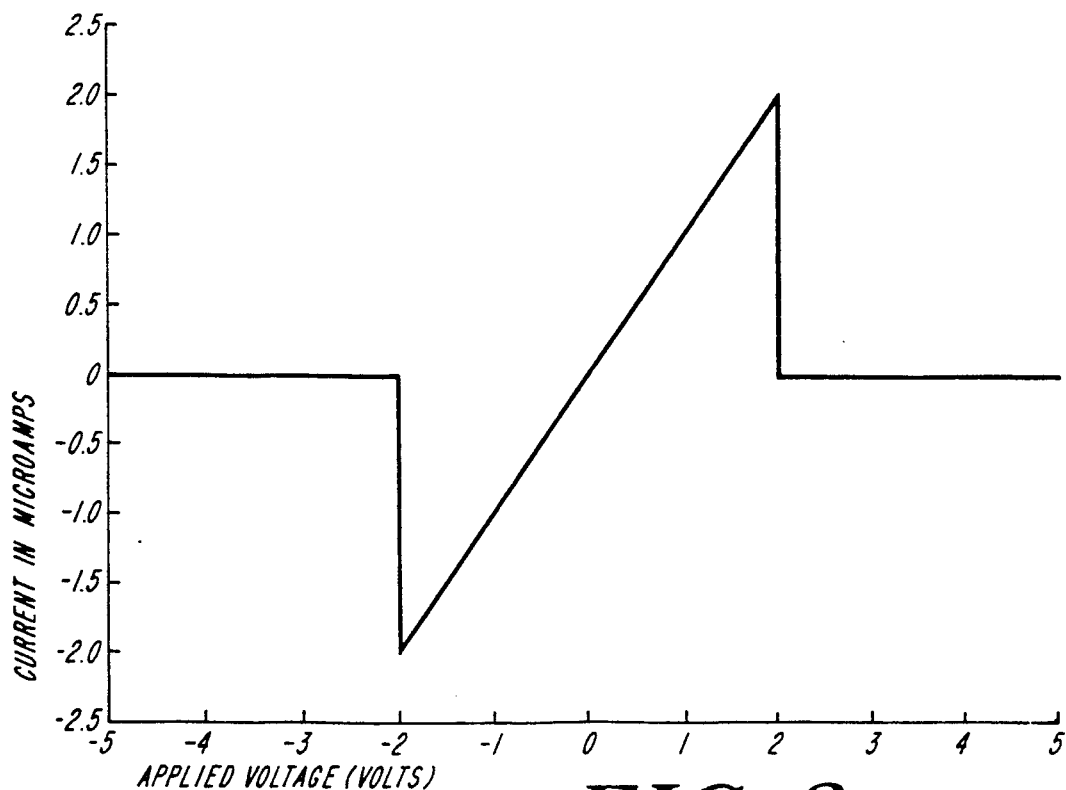
FIG. 3 is a plot of a representative ideal resistive fuse I-V characteristic.
Figure 4:
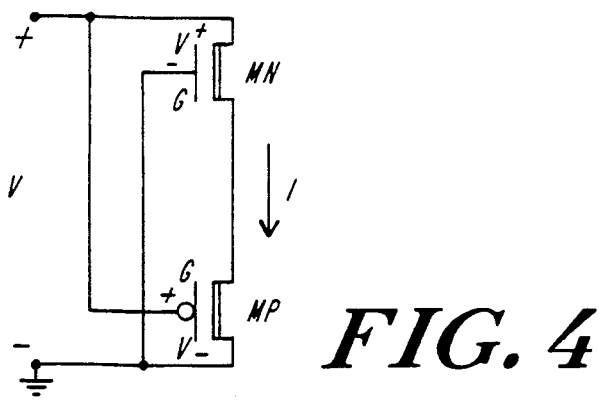
FIG. 4 is a circuit diagram of the Chua resistor, on which the resistive fuse circuit designs of the present invention are based.

The resistive fuse circuit designs of the present invention are based on a simple negative resistance circuit designed by Chua, Yu and Yu. The Chua circuit is shown in FIG. 4 and has the I-V characteristic shown in FIG. 5. MN and MP are n-channel and p-channel field effect transistors respectively. In the discussion that follows, a depletion mode MOSFET implementation is assumed, in which MN and MP are depletion-mode NMOS and PMOS transistors respectively. However, it will be clear to those skilled in the art that the circuit can also be made with n-channel and p-channel JFETs.

Figure 5:
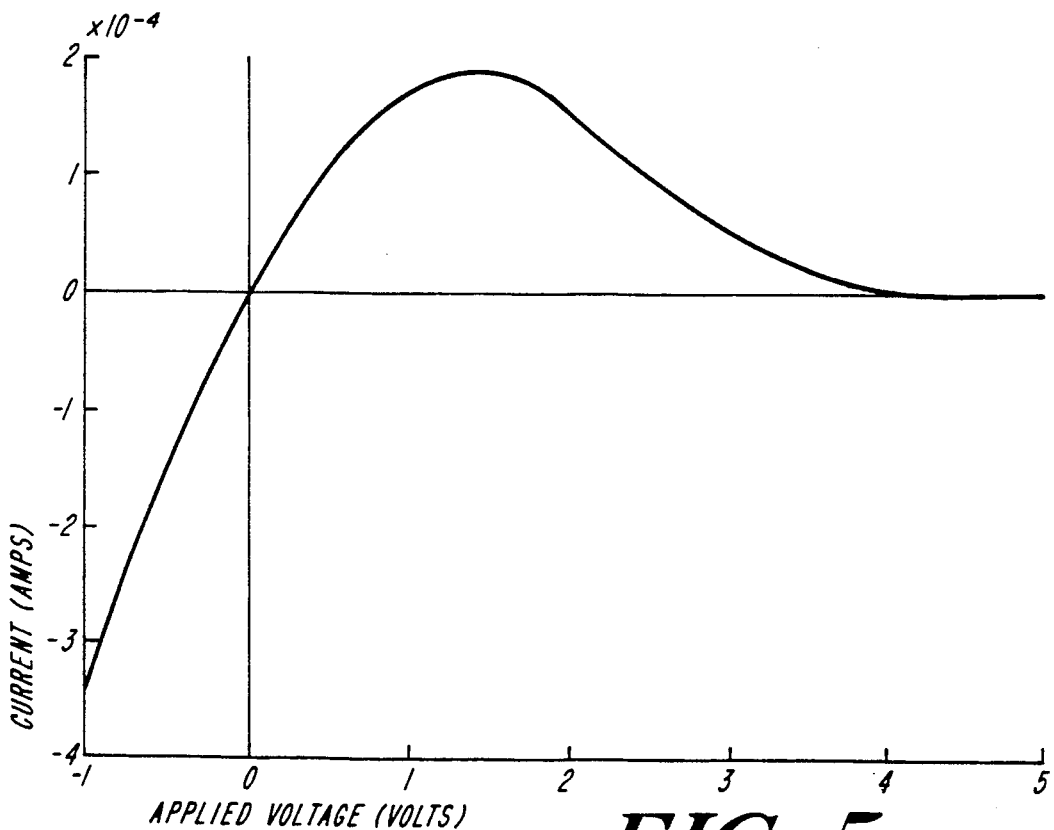
FIG. 5 is a plot of a representative I-V characteristic of the Chua resistor.

The I-V characteristic shown in FIG. 5 can be explained by the following. For V=0, I=0 because the transistors MN and MP do not act as current or voltage sources. For V<0, I is approximately linear for small V because MN and MP are depletion-mode devices and are in the linear region of operation when $V_{GS}=0$. As V becomes yet more negative, MN becomes more conductive because its gate remains grounded while its source voltage drops. The transistor MP also becomes more conductive because its gate potential drops while its source remains grounded. The resistance of the circuit decreases rapidly as V becomes more negative, so current increases sharply (in the negative direction). For V>0, I is again approximately linear for small V. As V increases further, MP begins to shut off because its gate voltage increases faster than its source voltage. This is clearer if one considers the case where MN and MP are symmetric devices, i.e., they have equal conductances and equal but opposite thresholds. By symmetry, the node shared by MN and MP will then always be at $\frac{1}{2}V$. $V_{SG}$ for MP is then $-\frac{1}{2}V$. As V increases, $V_{SG}$ decreases and tends to turn MP off. Likewise, MN tends to turn off for increasing V because its gate-source voltage decreases as V increases. The qualitative behavior of the I-V characteristic was verified using HSPICE to model the circuit and is shown in FIG. 5.

The quantitative behavior of the Chua circuit can be derived as follows. Let V and I be the voltage across and current through the circuit, respectively. $V_{tn}$ is the threshold voltage of the NMOS transistor and $V_{tp}$ is the threshold of the PMOS transistor. Note that for depletion-mode devices, $V_{tn}<0$ and $V_{tp}>0$. $M_n$ is the gain $\frac{1}{2}\mu_n C_{ox}W/L$ of the NMOS device and $M_p$ is the corresponding quantity for the PMOS device. There are five possibilities: MN and MP in the linear region, MN linear and MP saturated, MN saturated and MP linear, MN and MP saturated, and MN or MP cutoff. The models used are the standard square-law equations. For the NMOS transistor in the linear region, $$I=M_n[2(V_{GS}-V_{tn})-V_{DS}]V_{DS}.$$

For the PMOS transistor in the linear region, $$I=M_p[2(V_{SG}+V_{tp})-V_{SD}]V_{SD}.$$

For the NMOS transistor in the saturated region, $$I=M_n(V_{GS}-V_{tn})^2.$$

For the PMOS transistor in the saturated region, $$I=M_p(V_{SG}+V_{tp})^2.$$

Analysis shows the following:

MN will be in the linear region when $V<-V_{tn}$, in the saturated region when $-V_{tn}<V<-2V_{tn}$ and cutoff when $V>-2V_{tn}$, if MN and MP are symmetric devices, i.e., $V_{tn}=-V_{tp}$ and $M_n=M_p$.

MP will be in the linear region when $V<V_{tp}$, in the saturated region when $V_{tp}<V<2V_{tp}$ and cutoff when $V>2V_{tp}$, if MN and MP are symmetric devices.

When either MN or MP is in the linear resion, the current is given by $$I = k[aV^2 + bV + c + (V+d)\sqrt{eV^2+fV+g}],$$

where a,b,c,d,e,f, and g are all constants.

When both MN and MP are saturated, the current is given by $$I = \frac{M_n M_p}{(\sqrt{M_n}+\sqrt{M_p})^2}(V-V_{tp}+V_{tn})^2.$$

When either MN or MP is cutoff, no current flows.

Although it is possible for the transistors to be in different regions of operation, it is convenient to set $V_{tn} = -V_{tp}$ and $M_n = M_p$, which means that MN and MP are always in the same region of operation.

The behavior of the Chua resistor can be simplified from the expressions given above. The quantities of interest are the slope of the device in its linear region, the locations of the peaks, and the voltage required to reduce current to zero.

The slope of the Chua resistor in the linear region is found by setting $V_{DS} = V_{GS} = 0$ for both of the devices, since this will be approximately true for small applied voltages. The resistance is fairly easy to determine analytically, and turns out to be $$R = \frac{1}{2}\left(-\frac{1}{V_{tn}M_n} + \frac{1}{V_{tp}M_p}\right)$$

Simulation confirmed the above equation. Resistance values are approximately in the 10 KΩ range for W:L ratios for the devices of 1:1.

The location of the peak in the I-V characteristic must occur when MN or MP is in the linear region because the expression for current monotonically decreases with increasing V when MN and MP are saturated. It is very difficult to find the peak voltage analytically, but HSPICE simulation revealed that the voltage at which the peak occurs is very close to the threshold voltage of MN and MP, assuming that they are symmetric devices.

Back-gate effect is a problem of the Chua resistor. Back-gate effect is the variation in device threshold caused by variation in source-well voltage. As is known to those skilled in the art, proper circuit design can often greatly reduce or eliminate back-gate effect. However, in the present implementation, the options are limited due to the fact that both n-channel and p-channel devices are used. One solution is to make the oxide extremely thin. Some standard CMOS processes produce a very thin oxide. For example, the standard CMOS process at MIT's Integrated Circuit Laboratory produces a 230 Å oxide layer, which will tend to reduce back-gate effect.

Resistive Fuse Circuits

Figure 6:
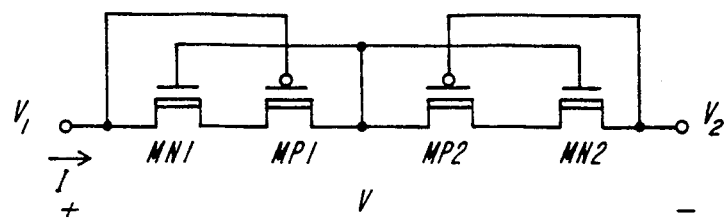
FIG. 6 is a circuit diagram of one embodiment of the resistive fuse of the present invention.

One embodiment of the resistive fuse of the present invention is formed by placing two of the Chua circuits in series, as shown in FIG. 6. The underlying idea of this embodiment is that if two elements are in series, and one of them is highly conductive while the other is resistive, the I-V characteristic will closely follow the characteristic of the resistive element. As seen in FIG. 5, the Chua circuit is highly conductive in the reverse (V<0) direction, and resistive in the forward direction (V>0).

In FIG. 6, MN1 and MN2 are n-channel field-effect transistors with preferably the same (negative) threshold. MP1 and MP2 are p-channel field-effect transistors with preferably the same (positive) threshold. The thresholds of the positive and negative transistors preferably have the same magnitude, but opposite signs. This device symmetry is convenient, but not required. The circuit of FIG. 6 can be implemented with depletion-mode MOSFETs or with JFETs.

Figure 7:
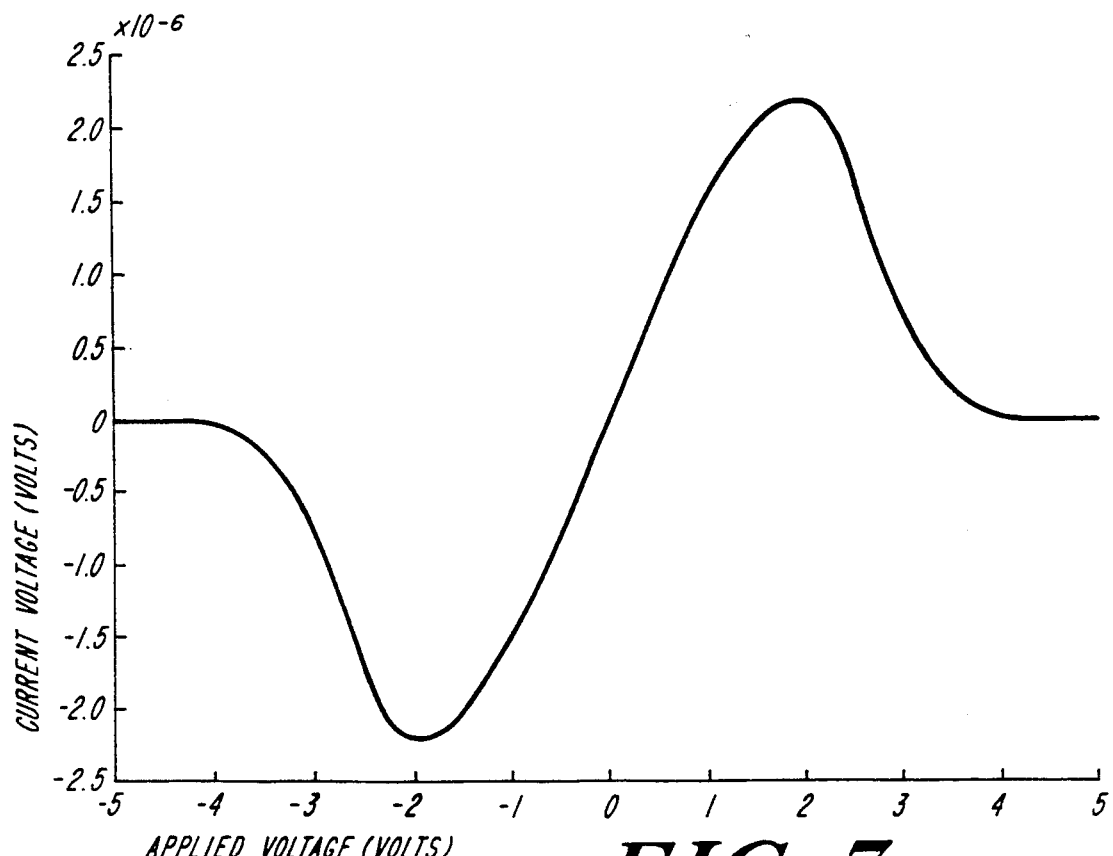
FIG. 7 is a plot of a representative I-V characteristic of the resistive fuse of FIG. 6.

A sample I-V characteristic of the resistive fuse with symmetric devices is shown in FIG. 7. For V>0, MN1 and MP1 are resistive and MP2 and MN2 are conductive, so the I-V characteristic of the resistive fuse is similar to that of the Chua circuit with a positive applied voltage. For V<0, MN1 and MP1 are conductive while MP2 and MN2 are resistive. Since the resistive fuse circuit is symmetric, the I-V characteristic will be symmetric about the origin.

The disadvantages of the circuit of FIG. 6 are, first, depletion NMOS and PMOS transistors are non-standard, and therefore require process modifications to incorporate these transistors. Second, the important parameters such as the linear region resistance and off-voltage are fixed by the transistor size and the process parameters, none of which can be varied once the circuit is fabricated.

Figure 8:
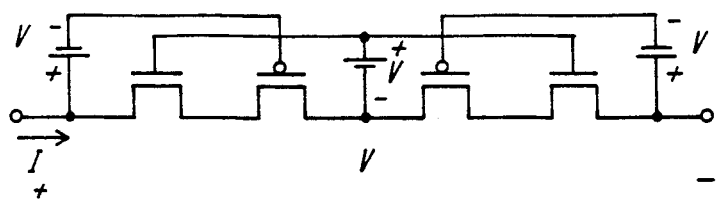
FIG. 8 is a circuit diagram of one embodiment of the resistive fuse of the present invention which can be implemented with all enhancement devices.
Figure 9:
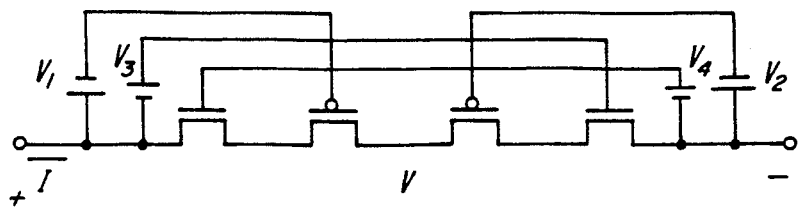
FIG. 9 is a circuit diagram of another embodiment of the resistive fuse which can be implemented with all enhancement devices.

A circuit that solves these problems is shown in FIG. 8. In this circuit, the voltage sources $V_3$-$V_5$ provide gate bias voltages so that the circuit is functionally identical to that in FIG. 6. In a MOSFET implementation the transistors can be all enhancement type so that standard CMOS processes can be used without any modifications. The voltage sources $V_3$-$V_5$ can be generated from MOSFETs or JFETS, or from switched capacitors, for example. One advantage of this circuit is that the control voltage sources $V_3$-$V_5$ can be made variable so that the linear region resistance and the off-voltage can be controlled. The disadvantage is that it takes many transistors to generate the control voltages. Embedded in a resistive grid, the control voltages $V_3$ and $V_4$ are shared by many of the adjacent resistive fuses, so that the effective number of transistors per control voltage is much reduced. However, the control voltage $V_5$ has to sense the voltage in the middle of the resistive fuse, and thus is not shared with any of the other resistive fuse. A great reduction of transistor count in the final grid can be achieved by modifying the transistor connection as shown in FIG. 9. In this embodiment, only the voltages at either end of the resistive fuse are sensed to generate the control voltages. Althought the effective number of transistors is much lower, the circuit is functionally similar to that in FIG. 8.

Figure 10:
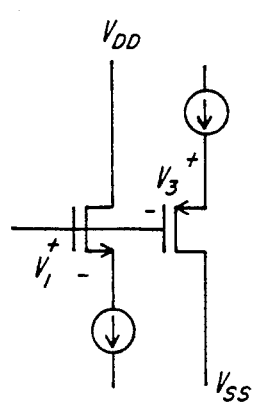
FIG. 10 is a circuit diagram of one embodiment of the control voltage generators required in the circuit of FIG. 9.
Figure 11:
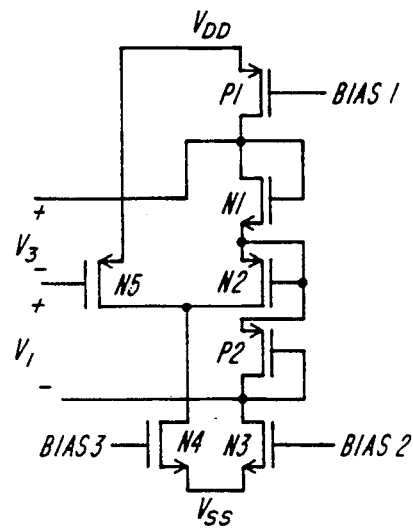
FIG. 11 is a circuit diagram of another embodiment of the control voltage generators required in the circuit of FIG. 9.
Figure 12:
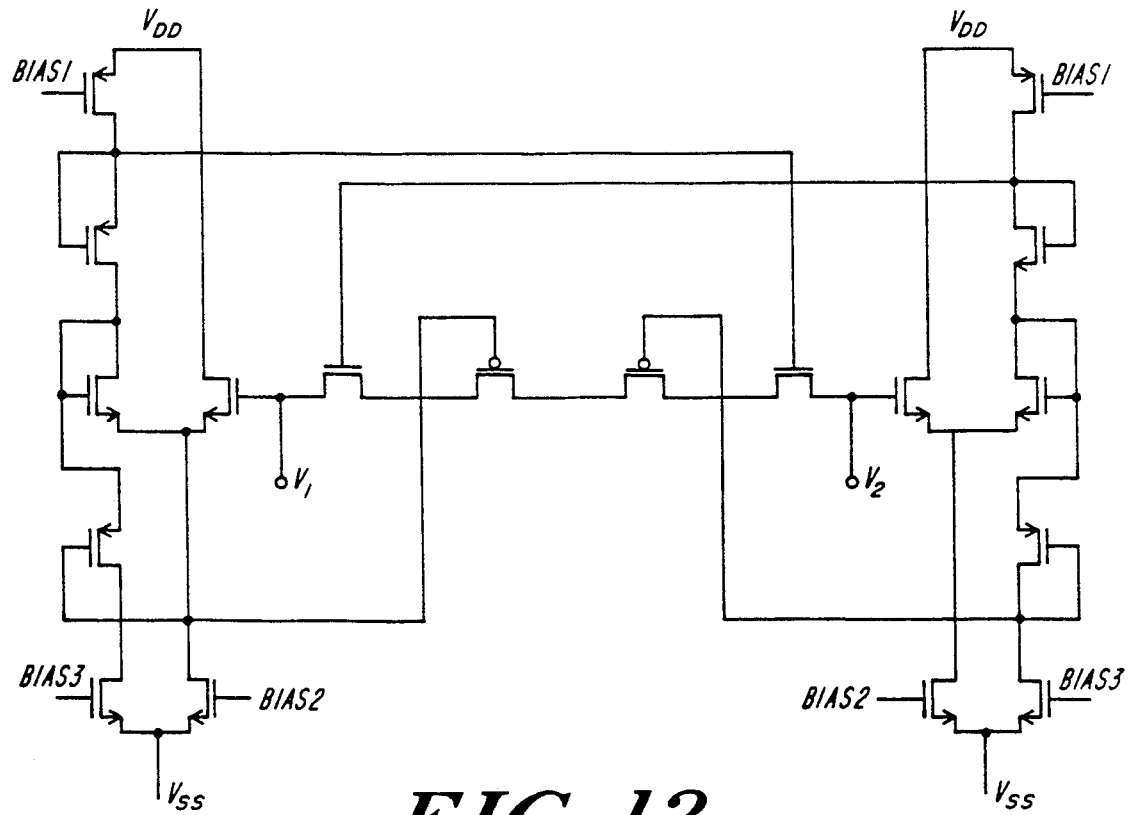
FIG. 12 is a complete circuit diagram of the resistive fuse of FIG. 9 with the control voltage generators of FIG. 11.

Two circuits that generate the necessary control voltages are shown in FIGS. 10 and 11. The circuit in FIG. 11 is more complex than that in FIG. 10, but is much less sensitive to threshold voltage variations due to process tolerances and back-gate effects. The complete resistive fuse circuit that incorporates the biasing circuit of FIG. 11 is shown in FIG. 12. This circuit requires 4 transistors per connection, and 7 transistors per node. By varying the bias currents in the control voltage circuit, parameters such as the linear resistance and the off-voltage can be controlled.

Figure 13:
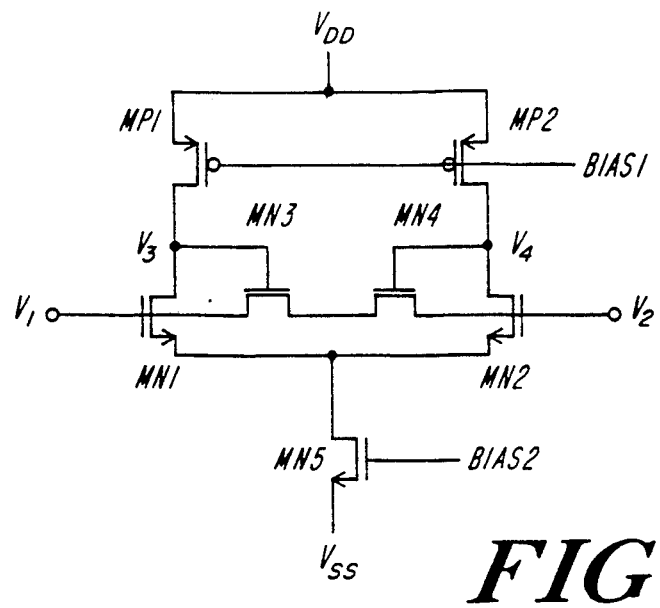
FIG. 13 is a circuit diagram of yet another embodiment of the resistive fuse of the present invention.

Another embodiment of the resistive fuse is shown in FIG. 13. The saturation currents of MP1 and MP2 are selected to be between ½ and 1 times that of MN5. For example, if the saturation currents of MP1 and MP2 are set at I, the saturation current of MN5 could be set at 1.5I. When the difference between $V_1$ and $V_2$ is small, the circuit is balanced, and both $V_3$ and $V_4$ are pulled up near $V_{DD}$, because the sum of the saturation currents of MP1 and MP2 is larger than the saturation current of MN5. Since MN3 and MN4 are in the triode region, the series combination of MN3 and MN4 acts as a linear resistor for small differences between $V_1$ and $V_2$. When $V_1$ is substantially larger than $V_2$, more current is steered to MN1. When the current through MN1 exceeds the saturation current of MP1 (I in this example), $V_3$ is pulled down near the source voltage of MN1, cutting MN3 off. For a symmetrical circuit, if $V_1$ is lower than $V_2$ by the same amount, MN4 will be cut off. As a result, the resistive fuse will exhibit a linear resistance for a range of $|V_1-V_2|$ determined by the bias condition and the device sizes, and will exhibit an open circuit when this range is exceeded.

Figure 14:
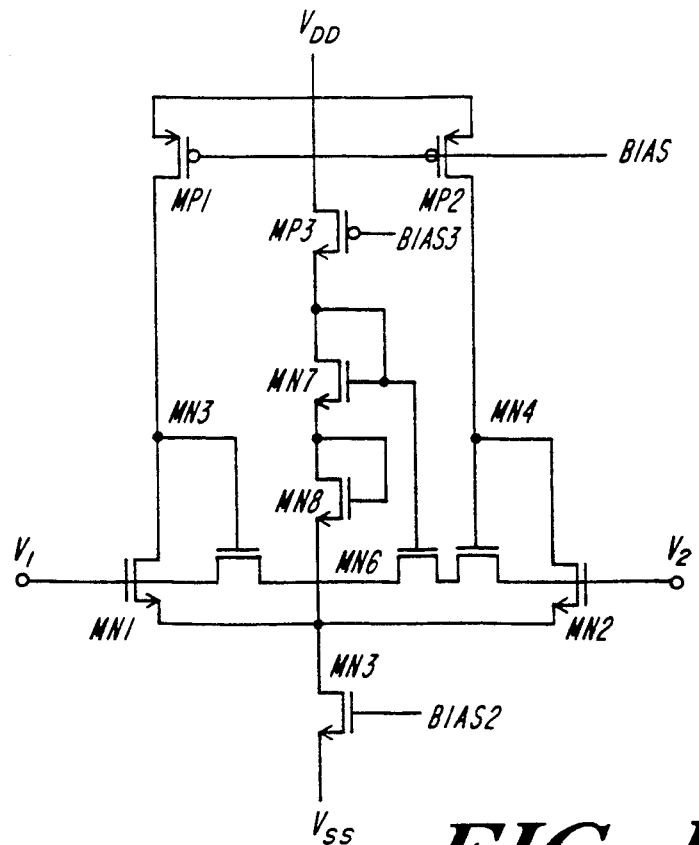
FIG. 14 is a circuit diagram of a variation of the embodiment of the resistive fuse shown in FIG. 13.

The drawback of the circuit in FIG. 13 is that the linear resistance value depends on the common-mode voltage because the gate-to-source voltage of MN3 and MN4 is a function of the common-mode voltage. Also, the circuit is sensitive to back-gate effect. The circuit shown in FIG. 14 improves this situation. In this circuit, either MN3 or MN4 will be cut off if $|V_1-V_2|$ exceeds the range as before. However, in this circuit, MN3 and MN4 are used as switches, not as linear resistors because the on-resistance of MN6 is made much larger than that of MN3 and MN4. In this circuit MP3, MN7, and MN8 provide the gate control voltage for MN6 so that its on-resistance is insensitive to the common-mode voltage and to back-gate effect. The parameters such as the linear resistance and the off-voltage can be controlled by varying the bias currents. The circuit in FIG. 14 requires 11 transistors per resistive fuse element, and none per node.

Early Vision Processing System

An early vision processing system according to the present invention includes a two-dimensional grid of any of the resistive fuse circuit elements described above. Each node of the grid is connected to each of its nearest neighbors by a resistive fuse circuit element. Each node is functionally connected to a sensing device which converts light into an electronic signal. Preferably, the grid of resistive fuse circuit elements and the sensing devices are all fabricated on a single microchip. The node voltages will represent the smoothed image either continuously, or in the case of a clocked approach, at regular intervals. These voltages can be read off the chip, or input to further processing circuits fabricated on the chip itself.

The conversion of light (photons) into electronic signals is a well-known technology. Charge coupled device technology is probably the most mature imaging method. Suitable sensing devices for the present invention are those that can be easily implemented in an integrated circuit process, a requirement that excludes photoconductors.

One class of sensing devices are those that generate charge per unit time in proportion to the light intensity incident on the device. Either a MOS capacitor or a p-n junction biased in a non-equilibrium condition are capable of acting as photon-to-charge converters. The operation of these devices is discussed in. Another class of sensing devices are those that convert photons directly to current, where the output current is proportional to the light intensity incident on the device. One method of accomplishing this is to use a p-n junction in which the reverse leakage current is modulated by the light intensity. This leakage current can then be amplified for further signal processing. A phototransistor uses the same mechanism, however, since the collector current of an open-base transistor is equal to $\beta i_R$ where $i_R$ is the reverse leakage current and $\beta$ is the current gain, the amplification takes place in the sensing device. These devices are discussed in.

The choice of a particular signal acquisition device should be based on ease of integration into the fabrication technology as well as ease of integration of the signal processing circuits. Since the devices mentioned above can be fabricated using state-of-the art integrated circuit technology, with either minor or no changes, the choice between the devices should be based on the signal processing circuits. In general, it is easier to employ analog MOS circuit design techniques when charge is the signal. In contrast, bipolar integrated circuit design is, in general, used when the signal is represented by current.

It is recognized that variations and modifications of the circuits of the present invention will occur to those skilled in the art, and it is intended that all such variations and modifications be included within the scope of the claims.

What is claimed is:

1. A resistive fuse circuit element having a first and second terminal comprising:

a first and a second n-channel depletion-mode MOS field effect transistor, and a first and a second p-channel depletion-mode MOS field effect transistor, each transistor having a gate and a first and second terminal, the first terminal of the resistive fuse being the first terminal of the first n-channel transistor and the second terminal of the resistive fuse being the second terminal of the second n-channel transistor, an electrical connection between the first terminal of the first n-channel transistor and the gate of the first p-channel transistor, an electrical connection between the second terminal of the second n-channel transistor and the gate of the second p-channel transistor, an electrical connection between the gate of the first n-channel transistor, the gate of the second n-channel transistor, the second terminal of the first p-channel transistor, and the first terminal of the second p-channel transistor, an electrical connection between the second terminal of the first n-channel transistor and the first terminal of the first p-channel transistor, and an electrical connection between the second terminal of the second p-channel transistor and the first terminal of the second n-channel transistor.

2. A resistive fuse circuit element having a first and second terminal comprising:

a first and a second n-channel junction field-effect transistor, and a first and a second p-channel junction field-effect transistor, each transistor having a gate and a first and second terminal, the first terminal of the resistive fuse being the first terminal of the first n-channel transistor and the second terminal of the resistive fuse being the second terminal of the second n-channel transistor, an electrical connection between the first terminal of the first n-channel transistor and the gate of the first p-channel transistor, an electrical connection between the second terminal of the second n-channel transistor and the gate of the second p-channel transistor, an electrical connection between the gate of the first n-channel transistor, the gate of the second n-channel transistor, the second terminal of the first p-channel transistor, and the first terminal of the second p-channel transistor, an electrical connection between the second terminal of the first n-channel transistor and the first terminal of the first p-channel transistor, and an electrical connection between the second terminal of the second p-channel transistor and the first terminal of the second n-channel transistor.

3. The resistive fuse circuit element of claims 1 or 2 wherein the first and second n-channel transistors have substantially the same threshold, the first and second p-channel transistors have substantially the same threshold, and the thresholds of the n-channel and p-channel transistors having substantially the same magnitudes but opposite signs.

4. A resistive fuse circuit element having a first and second terminal comprising:
- a first and a second n-channel field-effect transistor, and a first and a second p-channel field-effect transistor, each transistor having a gate and a first and second terminal, the first terminal of the resistive fuse being the first terminal of the first n-channel transistor and the second terminal of the resistive fuse being the second terminal of the second n-channel transistor,
- a first control voltage source electrically connected between the first terminal of the first n-channel transistor and the gate of the first p-channel transistor,
- a second control voltage source electrically connected between the second terminal of the second n-channel transistor and the gate of the second p-channel transistor,
- an first electrical connection between the gates of the first and second n-channel transistors,
- an second electrical connection between the second terminal of the first p-channel transistor and the first terminal of the second p-channel transistor,
- a third control voltage source electrically connected between said first electrical connection and said second electrical connection,
- an electrical connection between the second terminal of the first n-channel transistor and the first terminal of the first p-channel transistor, and
- an electrical connection between the second terminal of the second p-channel transistor and the first terminal of the second n-channel transistor.

5. The resistive fuse circuit element of claim 4 wherein the field-effect transistors are enhancement-mode MOSFETs.

6. The resistive fuse circuit element of claim 4 wherein the field-effect transistors are JFETs.

7. The resistive fuse circuit element of claim 4 wherein the first and second n-channel transistors have substantially the same threshold, the first and second p-channel transistors have substantially the same threshold, and the thresholds of the n-channel and p-channel transistors having substantially the same magnitudes but opposite signs.

8. The resistive fuse circuit element of claim 4 wherein said control voltage sources are generated from field-effect transistors.

9. The resistive fuse circuit element of claim 4 wherein said control voltages are generated from switched capacitors.

10. The resistive fuse circuit element of claim 4 wherein said control voltage sources are made variable so that the linear region resistance and the off-voltage of the resistive fuse circuit element can be controlled.

11. A resistive fuse circuit element having a first and second terminal comprising:
- a first and a second n-channel field-effect transistor, and a first and a second p-channel field-effect transistor, each transistor having a gate and a first and second terminal, the first terminal of the resistive fuse being the first terminal of the first n-channel transistor and the second terminal of the resistive fuse being the second terminal of the second n-channel transistor,
- a first control voltage source electrically connected between the first terminal of the resistive fuse and the gate of the first p-channel transistor,
- a second control voltage source electrically connected between the second terminal of the resistive fuse and the gate of the second p-channel transistor,
- a third control voltage source electrically connected between the first terminal of the resistive fuse and the gate of the second n-channel transistor,
- a fourth control voltage source electrically connected between the second terminal of the resistive fuse and the gate of the first n-channel transistor,
- an electrical connection between the second terminal of the first n-channel transistor and the first terminal of the first p-channel transistor,
- an electrical connection between the second terminal of the first p-channel transistor and the first terminal of the second p-channel transistor, and
- an electrical connection between the second terminal of the second p-channel transistor and the first terminal of the second n-channel transistor.

12. The resistive fuse circuit element of claim 11 wherein the field-effect transistors are enhancement-mode MOSFETs.

13. The resistive fuse circuit element of claim 11 wherein the field-effect transistors are JFETs.

14. The resistive fuse circuit element of claim 11 wherein the first and second n-channel transistors have substantially the same threshold, the first and second p-channel transistors have substantially the same threshold, and the thresholds of the n-channel and p-channel transistors have substantially the same magnitudes but opposite signs.

15. The resistive fuse circuit element of claim 11 wherein said control voltage sources are generated from field-effect transistors.

16. The resistive fuse circuit element of claim 11 wherein said control voltages are generated from switched capacitors.

17. The resistive fuse circuit element of claim 11 wherein said control voltage sources are made variable so that the linear region resistance and the off-voltage of the resistive fuse circuit element can be controlled.

18. The resistive fuse circuit element of claim 11 wherein said control voltages are generated from a first and a second circuit, said first and third control voltages being generated by said first circuit and said second and fourth control voltages being generated by said second circuit, each said circuit comprising:
- a first and second constant voltage source,
- a first and second constant current source,
- a p-channel field-effect transistor with a source, a gate, and a drain,
- an electrical connection between the source of said p-channel transistor and said first constant current source,
- an electrical connection between the drain of said p-channel transistor and said second constant voltage source,
- a n-channel field-effect transistor with a source, a gate, and a drain, an electrical connection between the gate of said p-channel transistor and the gate of said n-channel transistor, an electrical connection between the drain of said n-channel transistor and said first constant voltage source, and an electrical connection between the source of said n-channel transistor and said second constant current source, whereby said control voltages are provided via:

an electrical connection between the gate of said n-channel transistor of said first circuit and the first terminal of the resistive fuse, an electrical connection between the source of said p-channel transistor of said first circuit and the gate of the second n-channel transistor of the resistive fuse, an electrical connection between the source of said n-channel transistor of said first circuit and the gate of the first p-channel transistor of the resistive fuse, an electrical connection between the gate of said n-channel transistor of said second circuit and the second terminal of the resistive fuse, an electrical connection between the source of said p-channel transistor of said second circuit and the gate of the first n-channel transistor of the resistive fuse, and an electrical connection between the source of said n-channel transistor of said second circuit and the gate of the second p-channel transistor of the resistive fuse.

19. The resistive fuse of claim 11 wherein said control voltages are generated from a first and a second circuit, said first and third control voltages being generated by said first circuit and said second and fourth control voltages being generated by said second circuit, each said circuit comprising:

a first and second constant voltage source, a first, second, and third bias voltage source, a first p-channel field-effect transistor with a source, a gate, and a drain, an electrical connection between the source of said first p-channel transistor and said first constant voltage source, an electrical connection between the gate of said first p-channel transistor and said first bias voltage source, a first n-channel field-effect transistor with a source, a gate, and a drain, an electrical connection between the drain of said first p-channel transistor and the drain of said first n-channel transistor, an electrical connection between the gate and the drain of said first n-channel transistor, a second n-channel field-effect transistor with a source, a gate, and a drain, an electrical connection between the source of said first n-channel transistor and the drain of said second n-channel transistor, an electrical connection between the gate and the drain of said second n-channel transistor, a second p-channel field-effect transistor with a source, a gate, and a drain, an electrical connection between the gate of said second n-channel transistor and the source of said second p-channel transistor, an electrical connection between the gate of said second p-channel transistor and the drain of said second p-channel transistor, a third n-channel field-effect transistor with a source, a gate, and a drain, an electrical connection between the drain of said second p-channel transistor and the drain of said third n-channel transistor, an electrical connection between the gate of said third n-channel transistor and said second bias voltage source, an electrical connection between the source of said third n-channel transistor and said second constant voltage source, a fourth n-channel field-effect transistor with a source, a gate, and a drain, an electrical connection between the source of said fourth n-channel transistor and said second constant voltage source, an electrical connection between the gate of said fourth n-channel transistor and said third bias voltage source, a fifth n-channel field-effect transistor with a source, a gate, and a drain, an electrical connection between the drain of said fourth n-channel transistor and the source of said fifth n-channel transistor, an electrical connection between the source of said fifth n-channel transistor and the source of said second n-channel transistor, and an electrical connection between the drain of said fifth n-channel transistor and said first constant voltage source, whereby said control voltages are provided via:

an electrical connection between the gate of said fifth n-channel transistor of said first circuit and the first terminal of the resistive fuse, an electrical connection between the gate of said first n-channel transistor of said first circuit and the gate of the second n-channel transistor of the resistive fuse, an electrical connection between the gate of said second p-channel transistor of said first circuit and the gate of the first p-channel transistor of the resistive fuse, an electrical connection between the gate of said fifth n-channel transistor of said second circuit and the second terminal of the resistive fuse, an electrical connection between the gate of said first n-channel transistor of said second circuit and the gate of the first n-channel transistor of the resistive fuse, and an electrical connection between the gate of said second p-channel transistor of said second circuit and the gate of the second p-channel transistor of the resistive fuse.

20. The resistive fuse circuit element of claims 18 or 19 wherein the field-effect transistors are enhancement-mode MOSFETs.

21. The resistive fuse circuit element of claims 18 or 19 wherein the field-effect transistors are JFETs.

22. A resistive fuse circuit element having a first and second terminal comprising:

a first and a second n-channel field-effect transistor, each transistor having a gate, source, and drain, the first terminal of the resistive fuse being the gate of the first n-channel transistor and the second terminal of the resistive fuse being the gate of the second n-channel transistor, a first and a second p-channel field-effect transistor, each transistor having a gate, source, and drain, a third and fourth n-channel field-effect transistor, each transistor having a gate, and a first and second terminal, a fifth n-channel field-effect transistor having a gate, a source, and a drain, a first and second constant voltage source, a first and second bias voltage source, an electrical connection between the first constant voltage source and each of the sources of the first and the second p-channel transistors, an electrical connection between the gates of the first and the second p-channel transistors, an electrical connection between the gates of the first and the second p-channel transistors and said first bias voltage source, an electrical connection between the drain of the first p-channel transistor and the drain of the first n-channel transistor, an electrical connection between the drain of the first p-channel transistor and the gate of the third n-channel transistor, an electrical connection between the drain of the second p-channel transistor and the drain of the second n-channel transistor, an electrical connection between the drain of the second p-channel transistor and the gate of the fourth n-channel transistor, an electrical connection between the gate of the first n-channel transistor and the first terminal of the third n-channel transistor, an electrical connection between the second terminal of the third n-channel transistor and the first terminal of the fourth n-channel transistor, an electrical connection between the second terminal of the fourth n-channel transistor and the gate of the second n-channel transistor, an electrical connection between the sources of the first and the second n-channel transistors, an electrical connection between the sources of the first and the second n-channel transistors and the drain of the fifth n-channel transistor, an electrical connection between the gate of the fifth n-channel transistor and said second bias voltage source, and an electrical connection between the source of the fifth n-channel transistor and said second constant voltage source.

23. The resistive fuse circuit element of claim 22, in the absence of said electrical connection between the second terminal of the third n-channel transistor and the first terminal of the fourth n-channel transistor, further comprising:

a third p-channel field-effect transistor having a gate, a source, and a drain, a sixth n-channel field-effect transistor having a gate, and a first and second terminal, a seventh and eighth n-channel field-effect transistor each transistor having a gate, a source, and a drain, a third bias voltage source, an electrical connection between the second terminal of the third n-channel transistor and the first terminal of the sixth n-channel transistor, an electrical connection between the second terminal of the sixth n-channel transistor and the first terminal of the fourth n-channel transistor, an electrical connection between the gate of the sixth n-channel transistor and the gate of the seventh n-channel transistor, an electrical connection between the gate and the drain of the seventh n-channel transistor, an electrical connection between the drain of the seventh n-channel transistor and the drain of the third p-channel transistor, an electrical connection between the gate of the third p-channel transistor and said third bias voltage source, an electrical connection between the source of the third p-channel transistor and said first constant voltage source, an electrical connection between the source of the seventh n-channel transistor and the drain of the eighth n-channel transistor, an electrical connection between the drain and the gate of the eighth n-channel transistor, and an electrical connection between the source of the eighth n-channel transistor and the drain of the fifth n-channel transistor.

24. The resistive fuse circuit element of claims 22 or 23 wherein the field-effect transistors are enhancement-mode MOSFETs.

25. The resistive fuse circuit element of claims 22 or 23 wherein the field-effect transistors are JFETs.

26. The resistive fuse circuit element of claims 22 or 23 wherein said first and second n-channel field-effect transistors have substantially the same threshold, said first and second p-channel field-effect transistors have substantially the same threshold, and said third and fourth n-channel field-effect transistors have substantially the same threshold.

27. The resistive fuse circuit element of any of claims 1, 2, 4, 11, 18, 19, 22, or 23 fabricated with an oxide layer sufficiently thin to reduce back-gate effect.

28. A microchip comprising a two-dimensional grid of resistive fuse circuit elements of the types of any of claims 1, 2, 4, 11, 18, 19, 22, or 23 wherein each node of said grid is connected to each of its nearest neighbors by a resistive fuse circuit element.

29. A microchip comprising a two-dimensional grid of resistive fuse circuit elements of the type of claim 11 wherein each node of said grid is connected to each of its nearest neighbors by a resistive fuse circuit element, comprising only one pair of control voltage sources at each node which act as the first and third control voltage sources (or equivalently as the second and fourth control voltage sources) for every resistive fuse circuit element connected at said node.

30. A microchip comprising a two-dimensional grid of resistive fuse circuit elements of the types of claims 18 or 19, wherein each node of said grid is connected to each of its nearest neighbors by a resistive fuse circuit element, comprising only one said circuit at each node which acts as the first and third control voltage sources (or equivalently as the second and fourth control voltages sources) for every resistive fuse circuit element connected at said node.

31. A microchip comprising a two-dimensional grid of resistive fuse circuit elements wherein each node of said grid is connected to each of its nearest neighbors by a resistive fuse circuit element of a first or second type, said first type being the element of claim 11 and said second type being either of the elements of claims 18 or 19, comprising only one pair of control voltage sources at each node connected to an element of the first type, said pair acting as the first and third control voltage sources (or equivalently as the second and fourth control voltage sources) for every element of the first type connected at said node, and comprising only one control voltage circuit at each node connected to an element of the second type, said circuit acting as the first and third control voltage sources (or equivalently as the second and fourth control voltages sources) for every element of the second type connected at said node.

32. The microchip of claim 28 wherein each said node is functionally connected to a sensing device which converts light into an electronic signal, whereby a voltage is generated at each said node which is in relation to the intensity of light incident on each said device.

33. The microchip of claim 32 wherein said sensing elements are integrated directly in the microchip.

34. The microchip of claim 32 wherein each said node is electrically connected to ground by a capacitor and the voltage across the capacitor is generated by said sensing device.

35. The microchip of claim 32 wherein each node is electrically connected to ground by a resistor in series with a voltage generated by said sensing device.

* * * * *

UNITED STATES PATENT AND TRADEMARK OFFICE
CERTIFICATE OF CORRECTION

PATENT NO. : 5,223,754
DATED : June 29, 1993
INVENTOR(S) : Steve Decker, et al

It is certified that error appears in the above-indentified patent and that said Letters Patent is hereby corrected as shown below:

Column 1, line 6: insert -- This invention was made with government support under grant number MIP-8814612 awarded by the National Science Foundation. The government has certain rights in this invention.

Column 7, line 52: after "in" please insert -- 14, 15 --;

Column 7, line 64: after "in" please insert -- 16 --;

Column 9, line 29: delete "an" and insert therefor -- a --; and

Column 9, line 31: delete "an" and insert therefor -- a --.

Signed and Sealed this

Fifth Day of July, 1994

Attest:

BRUCE LEHMAN

*Attesting Officer*   *Commissioner of Patents and Trademarks*